United States Patent
Nam et al.

(10) Patent No.: US 12,298,838 B2
(45) Date of Patent: *May 13, 2025

(54) GROUPING POWER SUPPLIES FOR A SLEEP MODE

(71) Applicant: Micron Technology, Inc., Boise, ID (US)

(72) Inventors: Ki-Jun Nam, Boise, ID (US); Yantao Ma, Boise, ID (US); Yasushi Matsubara, Isehara (JP); Takamasa Suzuki, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 14 days.

This patent is subject to a terminal disclaimer.

(21) Appl. No.: 17/960,718

(22) Filed: Oct. 5, 2022

(65) Prior Publication Data

US 2023/0109187 A1    Apr. 6, 2023

Related U.S. Application Data

(63) Continuation of application No. 16/890,819, filed on Jun. 2, 2020, now Pat. No. 11,487,346.

(51) Int. Cl.
*G06F 1/00* (2006.01)
*G06F 1/3234* (2019.01)
(Continued)

(52) U.S. Cl.
CPC .......... *G06F 1/3296* (2013.01); *G06F 1/3275* (2013.01); *G11C 11/221* (2013.01); *G11C 11/2297* (2013.01)

(58) Field of Classification Search
CPC ..................................................... G06F 1/3275
See application file for complete search history.

(56) References Cited

U.S. PATENT DOCUMENTS

| 7,020,041 B2 | 3/2006 | Somasekhar et al. |
| 7,925,910 B2 | 4/2011 | Lee |

(Continued)

FOREIGN PATENT DOCUMENTS

| JP | 2003-243516 A | 8/2003 |
| JP | 2009-187611 A | 8/2009 |

(Continued)

OTHER PUBLICATIONS

International Search Report and Written Opinion received for PCT Patent Application No. PCT/US21/34360, mailed on Sep. 7, 2021, 8 pages.

(Continued)

*Primary Examiner* — Mohammed H Rehman
(74) *Attorney, Agent, or Firm* — Holland & Hart LLP

(57) ABSTRACT

Methods, systems, and devices for grouping power supplies for a power saving mode are described to configure a memory device with groups of internal power supplies whose voltage levels may be successively modified according to a group order signaled by an on-die timer. For example, when the memory device enters a deep sleep mode, respective voltage levels of a first group of internal power supplies may be modified to respective external power supply voltage levels at a first time, respective voltage levels of a second group of internal power supplies may be modified to respective external power supply voltage levels at a second time, and so on. When the memory device exits the deep sleep mode, the groups of internal voltage supplies may be modified from the respective external power supply voltage levels to respective operational voltage levels in a group order that is opposite to the entry group order.

20 Claims, 10 Drawing Sheets

(51) Int. Cl.
*G06F 1/3296* (2019.01)
*G11C 11/22* (2006.01)

(56) References Cited

U.S. PATENT DOCUMENTS

| | | | |
|---|---|---|---|
| 11,361,834 B1 | 6/2022 | Kumar et al. | |
| 11,487,346 B2* | 11/2022 | Nam | G06F 1/3296 |
| 2002/0097624 A1 | 7/2002 | Andersen et al. | |
| 2006/0114734 A1* | 6/2006 | Cruz | G11C 11/40626 |
| | | | 365/222 |
| 2006/0250745 A1* | 11/2006 | Butler | H05B 47/16 |
| | | | 361/160 |
| 2008/0074124 A1* | 3/2008 | Kolbli | G01R 31/52 |
| | | | 324/649 |
| 2009/0003099 A1* | 1/2009 | Safvi | G11C 11/40615 |
| | | | 365/201 |
| 2009/0196115 A1 | 8/2009 | Agari et al. | |
| 2010/0110766 A1 | 5/2010 | Wei et al. | |
| 2010/0195355 A1* | 8/2010 | Zheng | H02M 3/33507 |
| | | | 363/21.12 |
| 2012/0002332 A1 | 1/2012 | Riley | |
| 2016/0018868 A1 | 1/2016 | Shimada | |
| 2016/0302273 A1* | 10/2016 | Wee | H05B 45/10 |
| 2018/0033493 A1 | 2/2018 | Jeong | |
| 2019/0303236 A1 | 10/2019 | Ellis et al. | |
| 2020/0057485 A1 | 2/2020 | Chiang et al. | |
| 2020/0066310 A1 | 2/2020 | Rowley | |
| 2020/0126611 A1 | 4/2020 | Riho et al. | |
| 2020/0200618 A1* | 6/2020 | Brederlow | G01L 1/225 |
| 2021/0096634 A1* | 4/2021 | Fastow | G11C 16/30 |
| 2021/0373809 A1* | 12/2021 | Benisty | G06F 3/061 |

FOREIGN PATENT DOCUMENTS

| | | |
|---|---|---|
| JP | 2016-024561 A | 2/2016 |
| KR | 10-2012-0076017 A | 7/2012 |

OTHER PUBLICATIONS

Japan Patent Office, "Office Action," issued in connection with Japan Patent Application No. 2022-574093 dated Jan. 7, 2025 (14 pages) (8 pages of English Translation and 6 pages of Original Document).

* cited by examiner

GROUPING POWER SUPPLIES FOR A SLEEP MODE

CROSS REFERENCE

The present Application for Patent is a Continuation of U.S. patent application Ser. No. 16/890,819 by Nam et al., entitled "GROUPING POWER SUPPLIES FOR A POWER SAVING MODE," filed Jun. 2, 2020, assigned to the assignee hereof, and expressly incorporated by reference herein.

BACKGROUND

The following relates generally to one or more memory systems and more specifically to grouping power supplies for a power saving mode.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
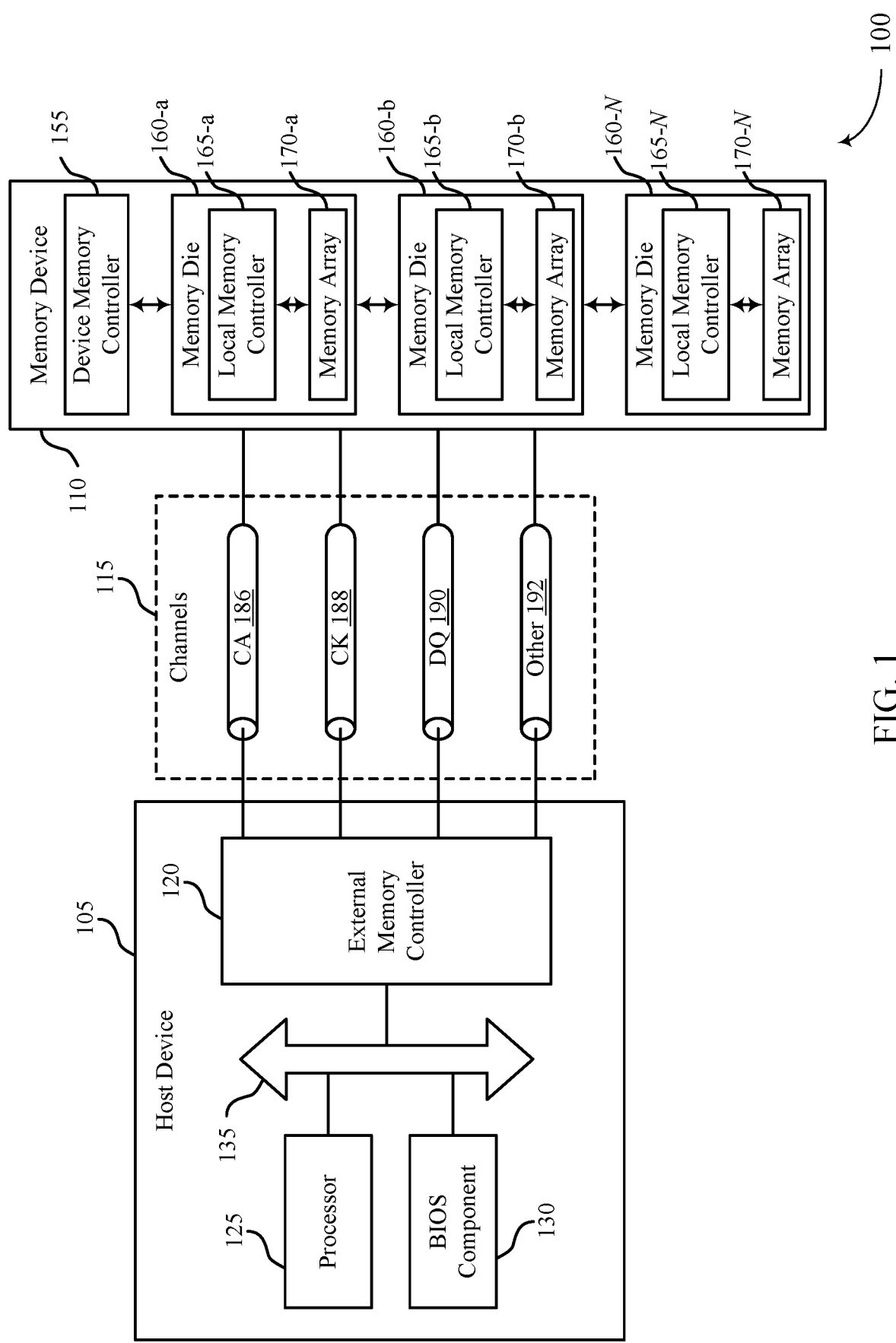
FIG. 1 illustrates an example of a system that supports grouping power supplies for a power saving mode in accordance with examples as disclosed herein.

Some memory devices (e.g., ferroelectric memory devices) use multiple internal power supplies to generate higher voltages for use in memory cell writing and/or reading procedures. In some cases, a memory device may enter a standby mode or sleep mode (e.g., a deep sleep mode), for example, in order to conserve power or prevent overuse. When entering the deep sleep mode, the memory device (e.g., a controller of the memory device) may modify respective voltage levels of the internal power supplies to respective lower voltage levels and may maintain the internal power supplies at the respective different voltage levels (e.g., lower voltage levels) during the deep sleep mode. In some cases, if the respective voltage levels of the internal power supplies are modified without regard to the sequence or order of modification, the voltage modification may cause data loss at some ferroelectric memory cells or may cause latch-up at one or more components of the memory device (e.g., due to a forward biasing of a junction in one or more components that creates a low impedance path between a positive supply voltage and a lower supply voltage or ground).

In order to mitigate possible effects associated with latch-up or forward biasing within components of a memory device during deep sleep entry or exit, the memory device may be configured with groups of internal power supplies whose voltage levels may be successively modified according to a group order signaled by an on-die timer. For example, when the memory device enters a deep sleep mode, respective voltage levels of a first group of internal power supplies may be modified to respective external power supply voltage levels at a first time, respective voltage levels of a second group of internal power supplies may be modified to respective external power supply voltage levels at a second time, and so on. When the memory device exits the deep sleep mode, the groups of internal voltage supplies may be modified from the respective external power supply voltage levels to respective operational voltage levels in a group order that is opposite to the deep sleep entry group order.

The voltage modification mechanism may include one or more bleeder circuits and one or more clamp circuits, where the clamp circuits may be enabled by comparing a respective internal power supply voltage level with a threshold related to a respective external power supply voltage (e.g., such that the clamp circuit may be enabled once the internal power supply voltage is within a threshold of the external power supply voltage). Ordering and modifying the internal voltage supplies according to groups in this manner may support power saving, reduce or prevent damaging effects from forward biasing or latch-up, reduce memory cell data loss (e.g., increase cell safety and reliability), and reduce peak current when exiting the deep sleep mode.

Features of the disclosure are initially described in the context of memory systems and dies as described with reference to FIGS. 1-2. Features of the disclosure are described in the context of non-linear electrical properties of a ferroelectric memory cell, timing diagrams, a voltage modification configuration, and a circuit diagram as described with reference to FIGS. 3-7. These and other features of the disclosure are further illustrated by and described with reference to an apparatus diagram and flowcharts that relate to grouping power supplies for a power saving mode as described with reference to FIGS. 8-10.

FIG. 1 illustrates an example of a system 100 that supports grouping power supplies for a power saving mode in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands. In some cases, a command from the host device 105 may indicate for the memory device 110 to enter a sleep mode. For example, the host device 105 may indicate for the memory device 110 to enter a sleep mode in which some memory device functions are shut down and in which some other memory device functions are still operable. Additionally or alternatively, the host device 105 may indicate for the memory device 110 to enter a deep sleep mode, in which all but the most critical memory device functions, power supplies, and voltages are shut down.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. A memory die may, in some cases, include an on-die timer which may generate timing or clock pulses that may be used by components of the memory die (e.g., when executing one or more procedures).

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160. A device memory controller 155 (e.g., or other memory controller) may control operation of one or more components of a memory device 110 when entering a sleep mode, such as a deep sleep mode (e.g., based on a command received from the host device 105).

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In order to mitigate possible effects associated with latch-up or forward biasing within components of a memory device 110 during deep sleep entry or exit, the memory device 110 may be configured with groups of internal power supplies whose voltage levels may be successively modified according to a group order signaled by an on-die timer. For example, when the memory device 110 enters a deep sleep mode, respective voltage levels of a first group of internal power supplies may be modified to respective external power supply voltage levels at a first time, respective voltage levels of a second group of internal power supplies may be modified to respective external power supply voltage levels at a second time, and so on. When the memory device 110 exits the deep sleep mode, the groups of internal voltage supplies may be modified from the respective external power supply voltage levels to respective operational voltage levels in a group order that is opposite to the deep sleep entry group order.

The voltage modification mechanism may include one or more bleeder circuits and one or more clamp circuits, where the clamp circuits may be enabled by comparing a respective internal power supply voltage level with a threshold related to a respective external power supply voltage (e.g., such that the clamp circuit may be enabled once the internal power supply voltage is within a threshold of the external power supply voltage). Ordering and modifying the internal voltage supplies according to groups in this manner may support power saving, reduce or prevent damaging effects from forward biasing or latch-up, reduce memory cell data loss (e.g., increase cell safety and reliability), and reduce peak current when exiting the deep sleep mode.

Figure 2:
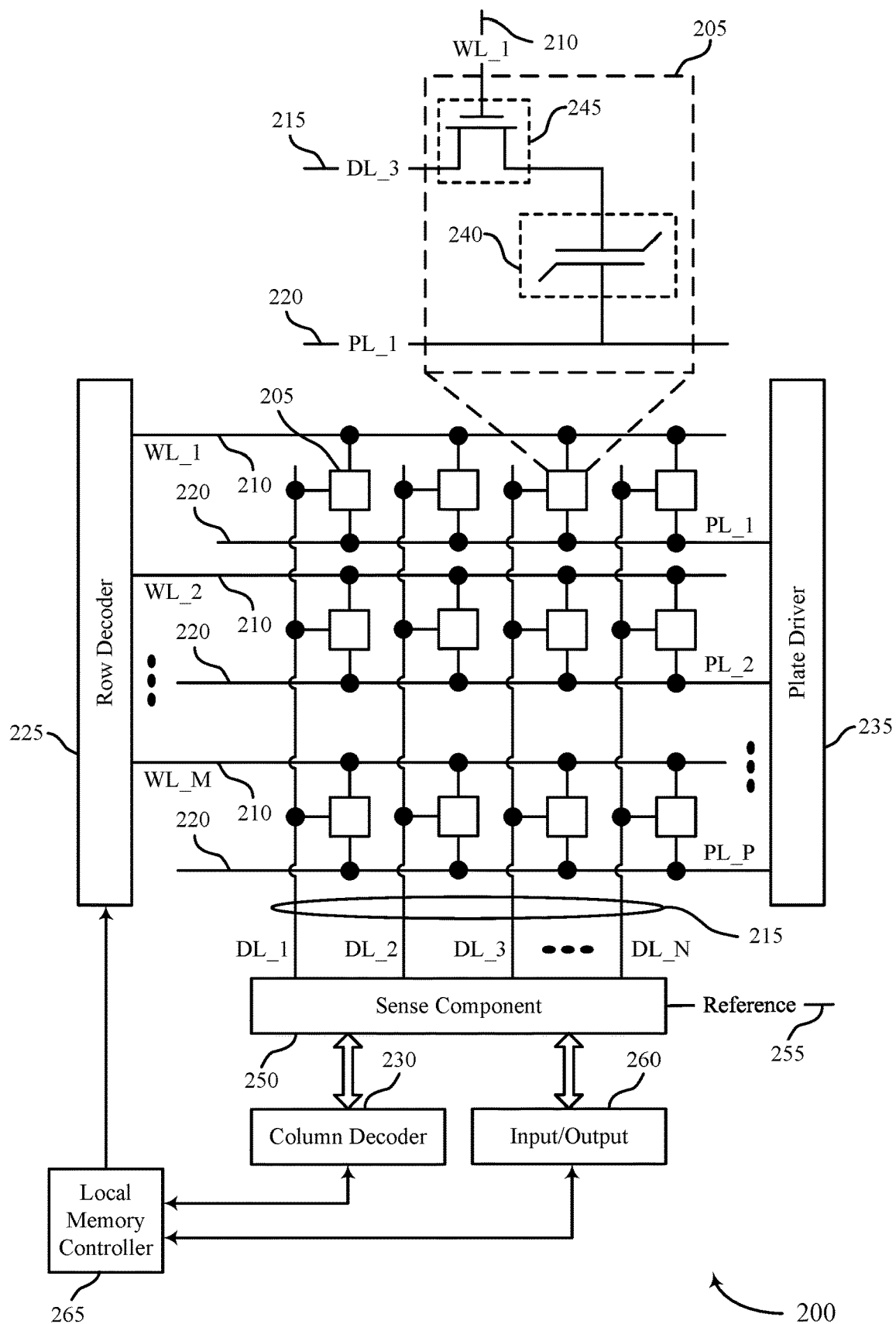
FIG. 2 illustrates an example of a memory die that supports grouping power supplies for a power saving mode in accordance with examples as disclosed herein.

FIG. 2 illustrates an example of a memory die 200 that supports grouping power supplies for a power saving mode in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

For example, a controller (e.g., a local memory controller 265) may be configured to successively modify voltage levels of different groups of internal power supplies, according to a group order signaled by an on-die timer. For example, when a memory device enters a deep sleep mode, the controller may initiate modification of respective voltage levels of a first group of internal power supplies to respective external power supply voltage levels at a first time, and may initiate modification of respective voltage levels of a second group of internal power supplies to respective external power supply voltage levels at a second time, and so on. Similarly, when the memory device exits the deep sleep mode, the controller may modify the groups of internal voltage supplies from the respective external power supply voltage levels to respective operational voltage levels in a group order that is opposite to the deep sleep entry group order.

Figure 3A:
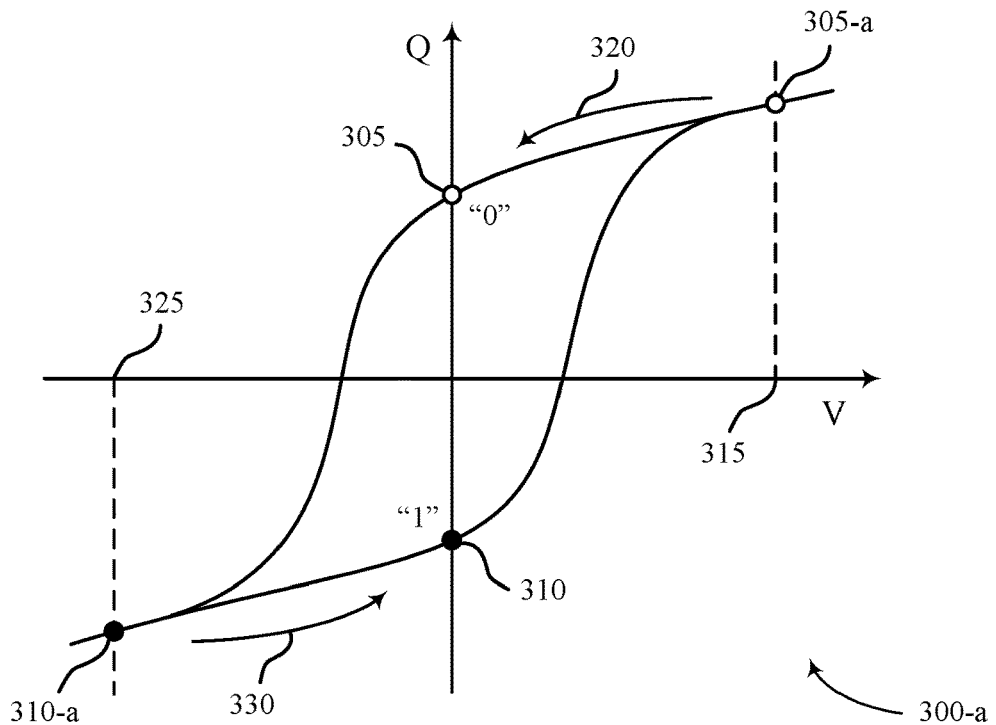
FIGS. 3A and 3B illustrate examples of non-linear electrical properties of a ferroelectric memory cell that support grouping power supplies for a power saving mode in accordance with examples as disclosed herein.
Figure 3B:
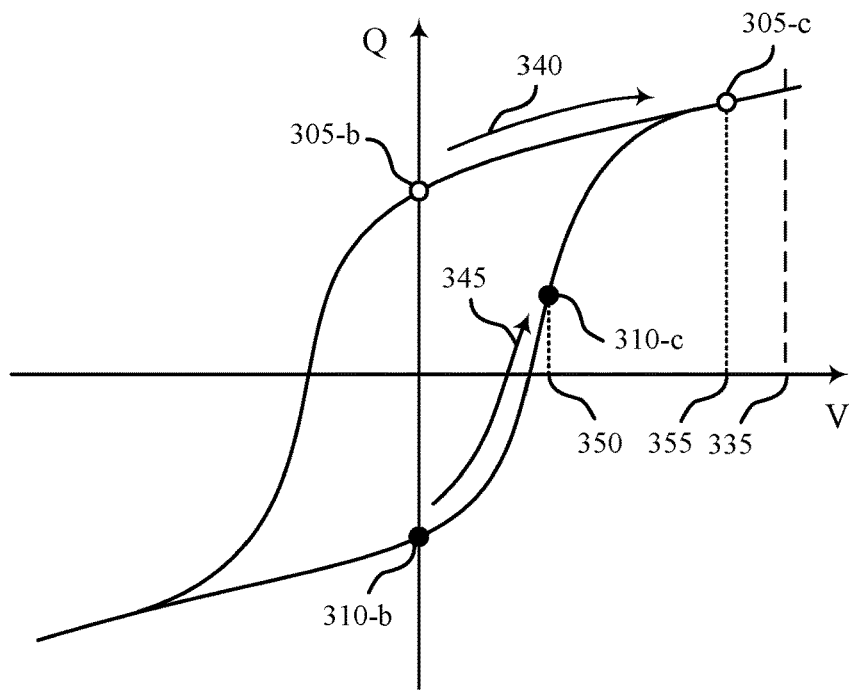

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)).

A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor 240 as discussed with reference to FIG. 2. In other examples, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on one or more factors, including the specific sensing scheme and circuitry.

In some examples, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the difference between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined. In some cases, a sense component may integrate charge read from the capacitor and may output an integrated charge level to determine the stored logic value of the ferroelectric memory cell.

In some examples, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some examples, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

In some examples, the voltages used to read or write a logic state associated with a memory cell (e.g., a ferroelectric capacitor) may be higher than one or more voltages supplied by one or more external power supplies coupled with a memory device (e.g., a memory array). For example, one or more of voltages 315, 325, 335, or the like, may be higher than any voltage available to be supplied by any external power supply associated with the memory device. Accordingly, a memory device may be associated with or may include internal power supplies (e.g., analog power supplies), which may be configured to provide the higher voltages used in a ferroelectric memory device.

The internal power supplies may provide voltage, current, or a combination thereof, by charge pumping, voltage regulating (e.g., via a regulator), or the like. In some cases, the internal power supplies may be configured to generate respective voltages, and the respective voltage may generate a certain amount of current (e.g., a controlled current) in one or more components of the memory device. For example, the one or more power supplies may supply or generate respective voltages for one or more memory cells (e.g., read or write operations on a ferroelectric capacitor), one or more sense amplifiers, sense amplifier control logic circuits, voltage level converters, other peripheral circuits, or any combination thereof.

A memory device may read or write logic states to memory cells in an operating mode or an active mode in which the one or more internal voltage supplies are available to supply voltage(s) for memory device operation. The one or more internal voltage supplies may be powered up (e.g., held at an operating voltage) during the operating mode, for example, in order to decrease a time to power up the one or more internal voltage supplies prior to performing a read function, a write function, or other memory device function. In some cases, a memory device may enter a standby mode or sleep mode (e.g., deep sleep mode), for example, in order to conserve power or prevent data loss. When entering the deep sleep mode, the memory device (e.g., or one or more controllers thereof) may modify respective voltage levels of the internal power supplies to respective lower voltage levels and may maintain the internal power supplies at the respective lower voltage levels during the deep sleep mode.

In some cases, if the respective voltage levels of the internal power supplies are modified at a same time or in some orders, the voltage change may cause data loss at some ferroelectric memory cells or may cause latch-up at one or more components of the memory device. Latch-up may occur when a low-impedance path is created between portions of a circuit, such as between combinations of well structures (e.g., P-type wells and N-type wells) and a substrate. If latch-up occurs in one or more components of the memory device, the one or more components may experience a parasitic current or voltage that may cause the one or more components to lose function (e.g., temporarily) or may cause permanent loss of function in the one or more components. In some cases, the latch-up may be associated with forward biasing, where a component may allow a continuous current flow that may disrupt or destroy component function. In some cases, high voltage transistors (e.g., P-type metal oxide semiconductor (PMOS) transistors) within the memory device may be associated with latch-up when the internal voltage supplies are modified to respective lower voltage levels in an order that forward biases a junction.

In order to mitigate possible effects associated with latch-up or forward biasing within components of a memory device during deep sleep entry or exit, the memory device may be configured with groups of internal power supplies whose voltage levels may be successively modified according to a group order controlled by an on-die timer. For example, when the memory device enters a deep sleep mode, respective voltage levels of a first group of internal power supplies may be modified to respective lower voltage levels at a first time, respective voltage levels of a second group of internal power supplies may be modified to respective lower voltage levels at a second time, and so on. When the memory device exits the deep sleep mode, the groups of internal voltage supplies may be modified from the respective lower voltage levels to respective operational voltage levels in a group order that is opposite to the deep sleep entry group order.

Ordering and modifying the internal voltage supplies according to groups may support power saving, reduce or prevent damaging effects from forward biasing or latch-up, reduce ferroelectric cell data loss (e.g., increase cell safety and reliability), and reduce peak current when exiting the deep sleep mode.

Figure 4:
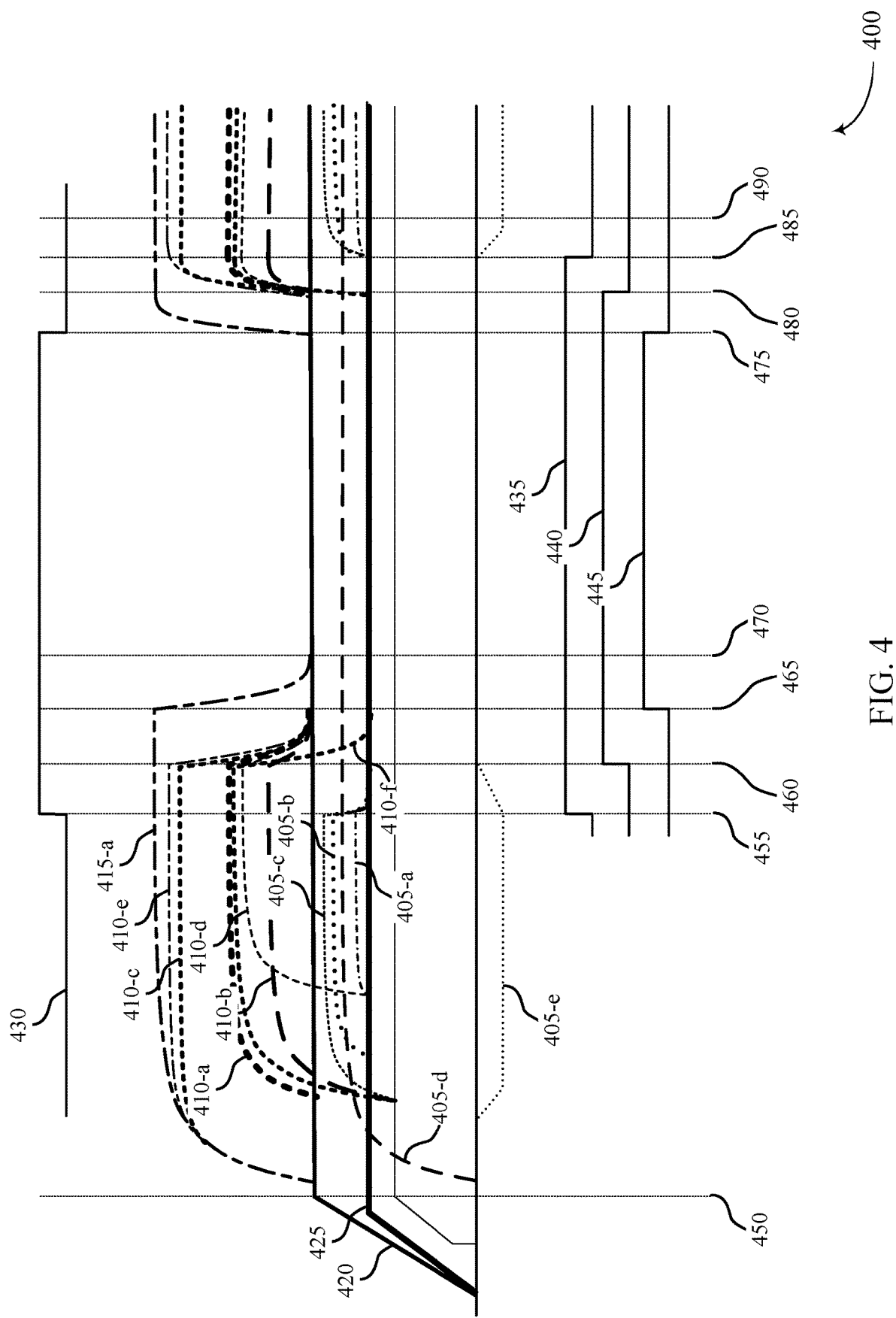
FIG. 4 illustrates an example of a timing diagram that supports grouping power supplies for a power saving mode in accordance with examples as disclosed herein.

FIG. 4 illustrates an example of a timing diagram 400 that supports grouping power supplies for a power saving mode in accordance with examples as disclosed herein. As described with reference to FIGS. 3A and 3B, internal power supplies of a memory device may be grouped for voltage modification operations (e.g., powering down and powering up internal power supplies) when entering or exiting a deep sleep mode. Timing diagram 400 may illustrate examples of different timings of the voltage modification operations when entering or exiting a deep sleep mode for various groups of internal power supplies.

According to various aspects, the internal power supplies of the memory device may be divided into groups according to relationships of the power supplies in circuits of the memory device. Constraints may be defined for various power supplies based on the circuit relationships, and the power supplies may be assigned to groups according to the constraints. For example, a memory device may include power supplies A, B, C, D, and E, and constraints may be determined from the circuit elements as B≥A, C≥B, D≥A, and E≥B. Thus, power supply A may be assigned to a first group, power supplies B and D assigned to a second group, and power supplies C and E assigned to a third group. Generally the groups of power supplies may include supplies of similar voltage ranges, however some internal power supplies may be assigned to a group with other power supplies of different voltage ranges (e.g., according to the constraints). Additionally or alternatively, latch-up risk may also be assessed, and power supplies may be assigned to the same or different groups according to latch-up risk. For example, where power supplies A and B have a constraint of B≥A, if latch-up risk is low based on the circuit elements supplied by A and B they may be assigned to a same group, while higher risk circuits supplied by A or B may lead to a determination to have power supplies A and B in different groups.

In one example, internal power supplies of a first group of internal power supplies may respectively correspond to internal power supply voltages 405-*a*, 405-*b*, 405-*c*, 405-*d*, and 405-*e*. Similarly, in one example, internal power supplies of a second group of internal power supplies may respectively correspond to internal power supply voltages 410-*a*, 410-*b*, 410-*c*, 410-*d*, 410-*e*, and 410-*f*, and one or more of the internal power supplies of a third group of internal power supplies may correspond to internal power supply voltage 415-*a*. The internal power supplies (e.g., regardless of the grouping of the internal power supplies) may be powered up according to a power-up sequence, for example, at or after device startup as represented by 450. At 450 (e.g., at device startup), one or more external power supplies, such as external power supplies represented by external power supply voltages 420 and 425, respectively, may reach an external power supply operation voltage level. Subsequently or at a same time, the internal power supplies may begin to increase their respective voltage levels (e.g., above the voltage level of an external power supply such as external power supply voltage 420 or 425) to respective operating voltage levels (e.g., using charge pump circuits or the like).

While the examples described herein with reference to FIG. 4 include three groups of internal power supplies, the examples may apply to any number of groups of internal power supplies. The number of groups of internal power supplies may be adjusted or configurable and may be based on operating conditions, power requirements, or so forth.

A host device associated with the memory device may provide or couple the memory device with the one or more external power supplies. The host device may, in some cases, transmit a command to the memory device indicating for the memory device to enter or exit a deep sleep mode. For example, at 455, the host device may transmit a first command indicating for the memory device to enter the deep sleep mode. The first command may generate (e.g., at the memory device) a latched signal 430 that indicates to the internal power supplies that the memory device is entering a deep sleep mode. The latched signal 430 may, for example, be received by an on-die timer of the memory device, where the on-die timer may then generate one or more signals to indicate for respective groups of internal power supplies to power down for the deep sleep mode. The on-die timer may program the order for entry and/or exit of the deep sleep mode for the respective groups of internal power supplies. The on-die timer may be generated or based on an internal clock of the memory device and may, for example, be coupled with a stable voltage or power supply in order to maintain operations during the deep sleep mode.

For example, at or after 455, the on-die timer may modify a state of a first signal 435 to represent a flag indicating for the first group of internal power supplies to power down for the deep sleep mode. The internal power supplies of the first group of internal power supplies may be powered down by modifying their respective voltages to a respective external supply voltage. For example, internal power supply voltages 405-*a*, 405-*b*, and 405-*c* may be modified to external power supply voltage 425 and internal power supply voltage 405-*e* may be modified to a zero voltage or a steady state voltage, beginning at or after 455. In some cases, the internal power supply voltages 405 may be modified via one or more bleeder circuits, which is further described herein with reference to FIGS. 6 and 7. In some cases, one or more voltages (e.g., internal power supply voltage 405-*d*) of a group of power supplies may not be modified and may be held at a steady voltage, for example, based on one or more deep sleep mode settings. Once the modified internal power supply voltages 405 reach a respective external power supply voltage, the internal power supply voltages 405 may be clamped to the external power supply voltage (e.g., maintained at the external power supply voltage). Clamping operations and circuitry are further described herein with reference to FIGS. 6 and 7.

At 460, the on-die timer may modify a state of a second signal 440 to represent a flag indicating for the second group of internal power supplies to be powered down for the deep sleep mode by modifying their respective voltages to a respective external supply voltage. For example, internal power supply voltages 410-*a* through 410-*e* may be modified to external power supply voltage 420 and internal power supply voltage 410-*f* may be modified to external power supply voltage 425, beginning at or after 460. Similar to the first group of internal power supplies, the internal power supply voltages 410 may be modified via one or more bleeder circuits and may be maintained at respective external power supply voltages via one or more clamper circuits.

At 465, the on-die timer may modify a state of a third signal 445 to represent a flag indicating for the third group of internal power supplies to be powered down for the deep sleep mode by modifying their respective voltages to a respective external supply voltage. For example, internal power supply voltage 415-*a* may be modified to external power supply voltage 420 beginning at or after 465. Each of the internal power supply voltages may reach a respective external power supply voltage by or before 470, such that the power down procedure may be completed at or before 470 and the entry time for the deep sleep mode may be represented by a time between 455 and 470. Similar to the first and second groups of internal power supplies, the internal power supply voltages 415 may be modified via one or more bleeder circuits and may be maintained at respective external power supply voltages via one or more clamper circuits.

At 475, the host device may transmit a second command indicating for the memory device to exit the deep sleep mode. The second command may change (e.g., at the memory device) latched signal 430, such that latched signal 430 may indicate to the internal power supplies that the memory device is exiting the deep sleep mode. The latched signal 430 may, for example, be received by an on-die timer of the memory device, where the on-die timer may then generate or modify one or more signals to indicate for respective groups of internal power supplies to power up for exiting the deep sleep mode. For example, at or after 475, the on-die timer may change the third signal 445 to represent a flag indicating for the third group of internal power supplies to power up for exiting the deep sleep mode. The internal power supplies of the third group of internal power supplies may be powered down by modifying their respective voltages from a respective external supply voltage to a respective operating voltage of the internal power supply. For example, internal power supply voltages 415-*a* may be modified (e.g., raised) from external power supply voltage 420 beginning at or after 475.

At 480, the on-die timer may change the second signal 440 to represent a flag indicating for the second group of internal power supplies to power up for exiting the deep sleep mode. The internal power supplies of the second group of internal power supplies may be powered down by modifying their respective voltages from a respective external supply voltage to a respective operating voltage of the internal power supply. For example, internal power supply voltages 410-*a* through 410-*d* may be modified (e.g., raised) from external power supply voltage 420 and internal power supply voltage 410-*f* may be modified (e.g., raised) from external power supply voltage 425, beginning at or after 480.

At 485, the on-die timer may change the first signal 435 to represent a flag indicating for the first group of internal power supplies to power up for exiting the deep sleep mode. For example, internal power supply voltages 405-*a*, 405-*b*, and 405-*c* may be modified (e.g., raised) from external power supply voltage 425 and internal power supply voltage 405-*e* may be modified (e.g., lowered) from a zero voltage or a steady state voltage, beginning at or after 485. Each of the internal power supply voltages may reach a respective operating voltage by or before 490, such that the power up procedure may be completed at or before 490 and the exit time for the deep sleep mode may be represented by a time between 475 and 490. In some cases, beginning at 490 (e.g., after each internal power supply has reached an operating voltage level), the memory device may resume operations in an awake mode (e.g., out of deep sleep mode).

In some cases, a sequence for the groups of internal power supplies to exit the deep sleep mode may be opposite of a sequence for the groups of internal power supplies to enter the deep sleep mode. In some cases, the time between modifying voltages for consecutive groups of internal power supplies (e.g., for deep sleep entry or exit) may be support modification of respective voltages of one group of internal power supplies before beginning to modify respective voltages of another group of internal power supplies.

As illustrated in FIG. 4 and as described herein, some internal power supplies within a same group may be modified and clamped to different external voltage levels (e.g., different external power supplies). The external voltage level to which an internal power supply is clamped may be based on an operating voltage level of the internal power supply, how close an internal power supply voltage level is to a respective external power supply voltage level, a safety factor for clamping the internal power supply to the respective external power supply voltage level, or a combination thereof, among other factors.

Figure 5:
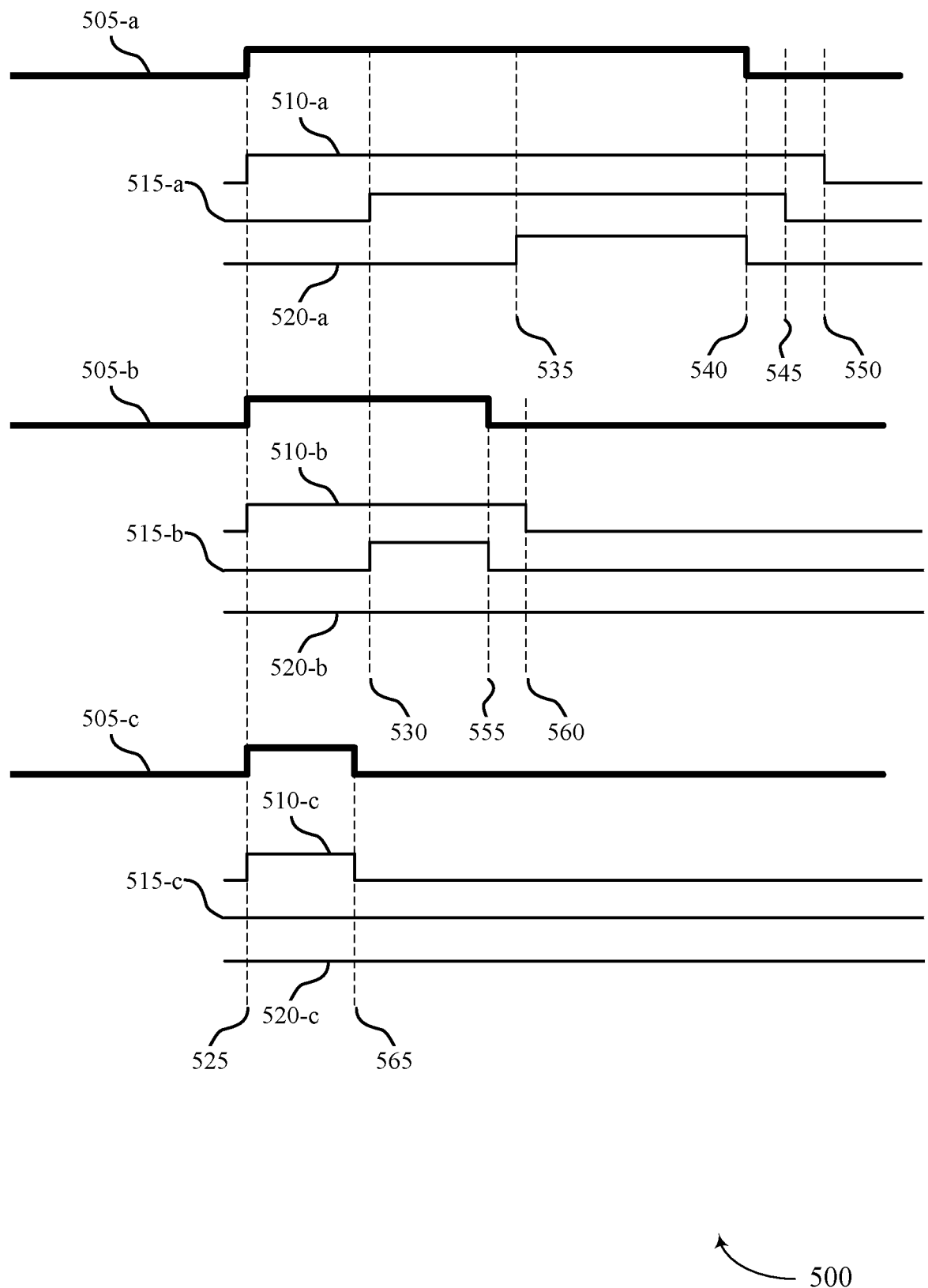
FIG. 5 illustrates an example of a timing diagram that supports grouping power supplies for a power saving mode in accordance with examples as disclosed herein.

FIG. 5 illustrates an example of a timing diagram 500 that supports grouping power supplies for a power saving mode in accordance with examples as disclosed herein. As described with reference to FIGS. 3 and 4, internal power supplies of a memory device may be grouped for voltage modification operations (e.g., powering down and powering up internal power supplies) when entering or exiting a deep sleep mode. Timing diagram 500 may illustrate examples of different timings of the voltage modification operations when entering or exiting a deep sleep mode for various groups of internal power supplies. In some cases, different groups of internal power supplies may or may not enter a deep sleep mode (e.g., be modified to an external power supply voltage level), for example, based on a duration of the deep sleep mode.

In one example, the internal power supplies of the memory device may be divided into three groups, for example, as described with reference to FIG. 4. While the examples described herein with reference to FIG. 5 describe three groups of internal power supplies, the examples may equally apply to any number of groups of internal power supplies. The number of groups of internal power supplies may be adjusted or configurable and may be based on operating conditions, power requirements, or so forth.

As described with reference to FIG. 4, a host device may, in some cases, transmit a command to the memory device indicating for the memory device to enter or exit a deep sleep mode. For example, at or before 525, the host device may transmit a first command indicating for the memory device to enter the deep sleep mode. The first command may generate (e.g., at the memory device) a latched signal 505 that may indicate for the internal power supplies to enter the deep sleep mode. The latched signal 505 may, for example, be received by an on-die timer of the memory device, where the on-die timer may then generate one or more signals to indicate for respective groups of internal power supplies to power down for the deep sleep mode. The host device may also transmit a second command indicating for the memory device to exit the deep sleep mode, and in some cases, the latched signal may end or may change based on the second command (e.g., in order to indicate for the on-die timer to exit the deep sleep mode). The on-die timer may program the order for entry and/or exit of the deep sleep mode for the respective groups of internal power supplies.

For example, the on-die timer may generate a first signal 510 that may represent a flag indicating (e.g., at a change from a first state to a second state) for the first group of internal power supplies to power down for the deep sleep mode, a second signal 515 that may represent a flag indicating (e.g., at a change from a first state to a second state) for the second group of internal power supplies to power down for the deep sleep mode, a third signal 520 that may represent a flag indicating (e.g., at a change from a first state to a second state) for the third group of internal power supplies to power down for the deep sleep mode. In some cases, one or more signals generated by the on-die timer may be based on a duration of the latched signal 505 associated with the deep sleep mode. For example, if the latched signal 505 changes or ends (e.g., to indicate exit from the deep sleep mode) before the on-die timer generates the second signal 515 and/or the third signal 520, the deep sleep mode may end without powering down the second and/or third group of internal power supplies. In this way, higher-voltage power supplies (e.g., associated with the second and/or third group) may not be powered down during shorter deep sleep modes, which may conserve power and reduce voltage disturbances.

In a first example, at 525, the on-die timer may receive a latched signal 505-*a* and may modify, at or after 525, a first signal 510-*a* to a state indicating for the first group of internal power supplies to enter deep sleep mode based on the latched signal 505-*a*. In response to the first signal 510-*a*, respective voltage levels of the first group of internal power supplies may be modified to respective external power supply voltage levels. At 530 and based on the latched signal 505-*a*, the on-die timer may modify a second signal 515-*a* to a state indicating for the second group of internal power supplies to enter deep sleep mode. In response to the second signal 515-*a*, respective voltage levels of the second group of internal power supplies may be modified to respective external power supply voltage levels. At 535 and based on the latched signal 505-*a*, the on-die timer may modify a third signal 520-*a* to a state indicating for the third group of internal power supplies to enter deep sleep mode. In response to the third signal 520-*a*, respective voltage levels of the third group of internal power supplies may be modified to respective external power supply voltage levels.

At or before 540, the host device may transmit the second command to the memory device indicating for the memory device to exit the deep sleep mode. At 540, the latched signal 505-*a* may change state, indicating for the memory device to exit the deep sleep mode. At or after 540 and based on the latched signal 505-*a*, the on-die timer may modify the third signal 520-*a* to a state indicating for the third group of internal power supplies to exit deep sleep mode. In response to the change in the third signal 520-*a*, respective voltage levels of the third group of internal power supplies may be modified from respective external power supply voltage levels to respective operating voltage levels.

At 545 and based on the latched signal 505-*a*, the on-die timer may modify the second signal 515-*a* to a state indicating for the second group of internal power supplies to exit deep sleep mode. In response to the change in the second signal 515-*a*, respective voltage levels of the second group of internal power supplies may be modified from respective external power supply voltage levels to respective operating voltage levels. At 550, and based on the latched signal 505-*a*, the on-die timer may modify the first signal 510-*a* to a state indicating for the first group of internal power supplies to exit deep sleep mode. In response to the change in the first signal 510-*a*, respective voltage levels of the second group of internal power supplies may be modified from respective external power supply voltage levels to respective operating voltage levels.

In a second example, at 525, the on-die timer may receive a latched signal 505-*b* and may modify, at or after 525, a first signal 510-*b* to a state indicating for the first group of internal power supplies to enter deep sleep mode based on the latched signal 505-*b*. In response to the first signal 510-*b*, respective voltage levels of the first group of internal power supplies may be modified to respective external power supply voltage levels. At 530 and based on the latched signal 505-*b*, the on-die timer may modify a second signal 515-*b* to a state indicating for the second group of internal power supplies to enter deep sleep mode. In response to the second signal 515-*b*, respective voltage levels of the second group of internal power supplies may be modified to respective external power supply voltage levels. At or before 555, the host device may transmit the second command to the memory device indicating for the memory device to exit the deep sleep mode. For example, the host device may transmit the second command before the third group of internal power supplies enters the deep sleep mode, such that the on-die timer may refrain from modifying the third signal 520-*b*.

At 555, the latched signal 505-*b* may change state, indicating for the memory device to exit the deep sleep mode. At or after 555 and based on the latched signal 505-*b*, the on-die timer may modify a second signal 515-*b* to a state indicating for the second group of internal power supplies to exit deep sleep mode. In response to the change in the second signal 515-*b*, respective voltage levels of the second group of internal power supplies may be modified from respective external power supply voltage levels to respective operating voltage levels. At 560, and based on the latched signal 505-*b*, the on-die timer may modify the first signal 510-*b* to a state indicating for the first group of internal power supplies to exit deep sleep mode. In response to the change in the first signal 510-*b*, respective voltage levels of the second group of internal power supplies may be modified from respective external power supply voltage levels to respective operating voltage levels.

In a third example, at 525, the on-die timer may receive a latched signal 505-*c* and may modify, at or after 525, a first signal 510-*c* to a state indicating for the first group of internal power supplies to enter deep sleep mode based on the latched signal 505-*c*. In response to the first signal 510-*c*, respective voltage levels of the first group of internal power supplies may be modified to respective external power supply voltage levels. At or before 565, the host device may transmit the second command to the memory device indicating for the memory device to exit the deep sleep mode. For example, the host device may transmit the second command before either of the second group or the third group of internal power supplies enters the deep sleep mode, such that the on-die timer may refrain from modifying the second signal 515-*c* and the third signal 520-*c*.

At 565, the latched signal 505-*c* may change state, indicating for the memory device to exit the deep sleep mode. At or after 565 and based on the latched signal 505-*c*, the on-die timer may modify the first signal 510-*c* to a state indicating for the first group of internal power supplies to exit deep sleep mode. In response to the change in the first signal 510-*c*, respective voltage levels of the second group of internal power supplies may be modified from respective external power supply voltage levels to respective operating voltage levels.

Figure 6:
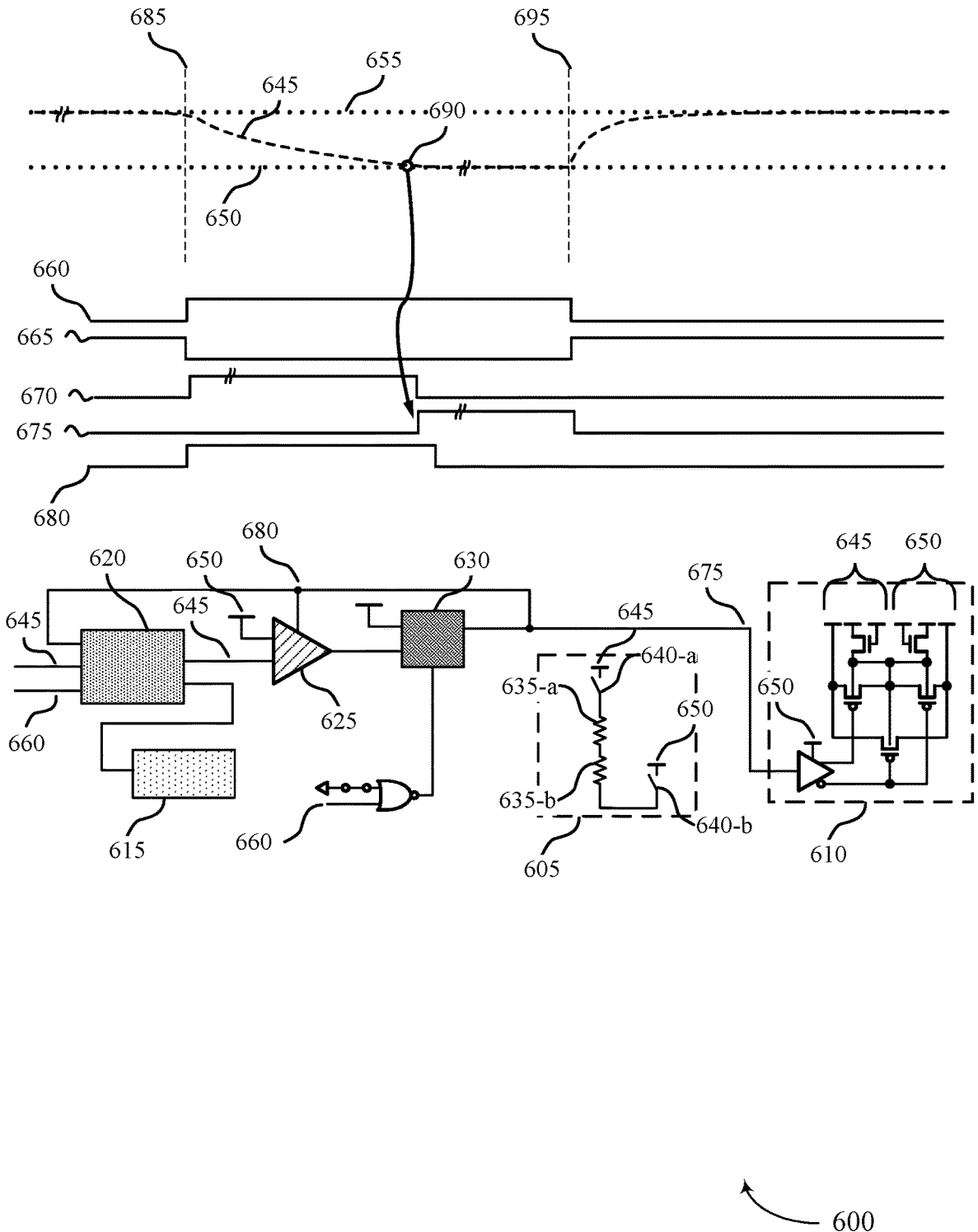
FIG. 6 illustrates an example of a voltage modification configuration that supports grouping power supplies for a power saving mode in accordance with examples as disclosed herein.

FIG. 6 illustrates an example of a voltage modification configuration 600 that supports grouping power supplies for a power saving mode in accordance with examples as disclosed herein. As described with reference to FIGS. 3-5, internal power supplies of a memory device may be grouped for voltage modification operations (e.g., powering down and powering up internal power supplies) when entering or exiting a deep sleep mode. Voltage modification configuration 600 may illustrate circuits and associated operation timings for modifying (e.g., bleeding) and maintaining (e.g., clamping) an internal power supply voltage 645 to a respective external power supply voltage 650. The internal power supply voltage 645 and the external power supply voltage 650 may respectively correspond to an internal power supply 615 of the memory device (e.g., a voltage pump and/or oscillator) and an external power supply of the memory device.

Voltage modification configuration 600 may include a bleeder circuit 605 for modifying the internal power supply voltage 645 from an operating voltage 655 to the external power supply voltage 650, and a clamper circuit 610 for maintaining the internal power supply voltage 645 at the external power supply voltage 650. As described herein, at 685, an on-die timer of the memory device may modify a signal 660 to a state indicating for the internal power supply to enter a deep sleep mode. The signal 660 may reset a latch 630 associated with a circuit for modifying the internal power supply voltage 645. In response to the signal 660, an internal power supply signal 665 may switch to an "off" state, for example, indicating for a pump of the internal power supply 615 to turn off. Similarly, in response to the signal 660, a bleeder signal 670 may be modified, which may activate the bleeder circuit 605 in order to modify the internal power supply voltage 645 to the external power supply voltage 650 via a leakage current and a current of the bleeder circuit 605. For example, one or more switching components 640 of the bleeder circuit may be engaged in response to the bleeder signal 670.

In some cases, the bleeder circuit 605 may include one or more resistors 635 or one or more current sources that may support modification of the internal power supply voltage 645 by bleeding power from the internal power supply 615 and other signal traces or components connected to the internal power supply voltage 645. In some cases, a current and associated power consumption of the bleeder circuit 605 may be less than a current and associated power consumption of the external power supply voltage 650 such that the bleeder circuit 605 may not have an effect on the external power supply voltage 650. For example, the current of the bleeder circuit 605 may inject substantially less charge than is consumed by other components connected to the external power supply voltage 650.

In response to the signal 660, a comparator signal 680 may be modified to a state indicating for a comparator 625 associated with the internal power supply 615 to be activated in order to compare the internal power supply voltage 645 and the external power supply voltage 650 (e.g., or with a threshold from the external power supply voltage 650). When the internal power supply voltage 645 reaches a voltage within the threshold from the external power supply voltage 650 (e.g., a defined threshold for deep sleep mode voltage), for example at 690, the comparator 625 may deactivate the bleeder circuit 605 (e.g., may deactivate the bleeder signal 670, which may deactivate the one or more switching components 640) and may activate the clamper circuit 610 (e.g., may activate or generate a clamper signal 675). After deactivating the bleeder circuit 605 and activating the clamper circuit 610 the comparator 625 may deactivate (e.g., based on the comparator signal 680 being deactivated).

The clamper circuit 610 may be configured to clamp one or more instances of the internal power supply voltage 645 with the external power supply voltage 650 to clamp or maintain the internal power supply voltage 645 at the external power supply voltage 650. For example, the clamper circuit 610 may include one or more transistors (e.g., PMOS or N-type metal oxide semiconductor (NMOS) transistors) that may be enabled by the change in state in the clamping signal 675 to couple the internal power supply voltage 645 with the external power supply voltage 650.

At or before 695, the on-die timer may modify the signal 660 to a state indicating for the internal power supply 615 to exit the deep sleep mode. In response to the signal 660, the internal power supply signal 665 may switch to an "on" signal, for example, indicating for a pump of the internal power supply 615 to turn back on. Similarly, in response to the signal 660, the clamping signal 675 may be switched off, which may power down the clamper circuit 610 such that the internal power supply voltage 645 may return to the operating voltage 655 and the internal power supply 615 may exit the deep sleep mode.

Figure 7:
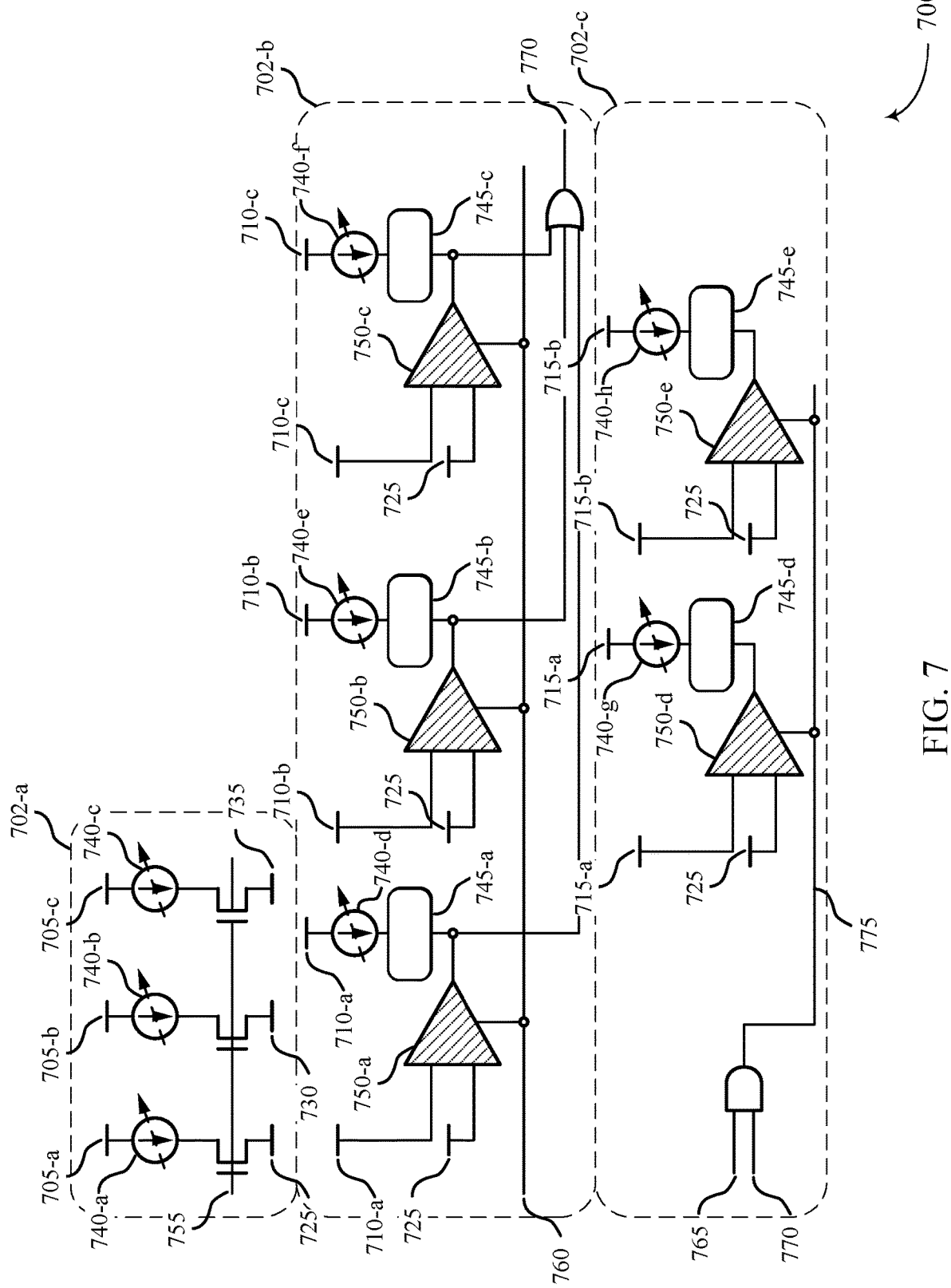
FIG. 7 illustrates an example of a circuit diagram that supports grouping power supplies for a power saving mode in accordance with examples as disclosed herein.

FIG. 7 illustrates an example of a circuit diagram 700 that supports grouping power supplies for a power saving mode in accordance with examples as disclosed herein. As described with reference to FIGS. 3-6, internal power supplies of a memory device may be grouped for voltage modification operations (e.g., powering down and powering up internal power supplies) when entering or exiting a deep sleep mode. Circuit diagram 700 may illustrate examples of voltage modification (e.g., bleeding) and maintenance (e.g., clamping) operations, for example, as described with reference to FIG. 6.

In one example, internal power supplies of a first group of internal power supplies 702-a may respectively correspond to internal power supply nodes 705-a, 705-b, and 705-c. Similarly, in one example, internal power supplies of a second group of internal power supplies 702-b may respectively correspond to internal power supply nodes 710-a, 710-b, and 710-c, and one or more of the internal power supplies of a third group of internal power supplies 702-c may correspond to internal power supply nodes 715-a and 715-b. In some cases, one or more of the voltages described herein (e.g., a voltage at a node) may represent multiple voltages of a same group of internal power supplies that share a same node in the circuit diagram 700 for the sake of illustration. While the examples described herein with reference to FIG. 7 include three groups of internal power supplies, the examples may apply to any number of groups of internal power supplies.

The voltages described herein may be coupled with respective bleeder circuits 740, clamping circuits 745, or a combination thereof. In some cases, respective bleeder circuits 740 and/or clamping circuits 745 may be coupled with respective comparators 750, for example, to compare the voltage of an internal power supply with a voltage of an external power supply (e.g., external power supply voltages 725, 730, and/or 735). The bleeder circuits 740 and comparators 750 may function, for example, as described with reference to FIG. 6.

The first group of internal power supplies 702-a (e.g., and corresponding internal power supply nodes 705) may be modified to respective external voltages based on a first signal 755, which, for example, may activate one or more transistors and corresponding bleeder circuits 740. For example, the voltage on internal power supply node 705-a may be modified to an external power supply voltage 725, the voltage on internal power supply node 705-b may be modified (e.g., coupled to via a bleeder circuit 740) to an external power supply voltage 730, and the voltage on internal power supply node 705-c may be modified to an external power supply voltage 735. Similarly, the second group of internal power supplies 702-b (e.g., and voltages at corresponding internal power supply nodes 710) may be modified to respective external voltages based on a second signal 760 (e.g., which may be generated by the on-die timer), which, for example, may activate corresponding bleeder circuits 740 and comparators 750. The respective voltages at internal power supply nodes 710-a, 710-b, and 710-c may be modified to an external power supply voltage 725, for example, using a respective bleeder circuit 740 and clamper circuit 745. Activation of signal 760 (e.g., transitioning to a logic state corresponding to modifying of the second group of internal power supplies 702-b) may, for example, enable bleeder circuits 740-d, 740-e, and 740-f, and enable comparators 750-a, 750-b, and 750-c. Bleeder circuits 740-d, 740-e, and 740-f may be enabled until the respective comparator 750-a, 750-b, or 750-c determines that the voltage at respective internal power supply node 710 is within a threshold of external power supply voltage 725. When the voltage at the respective internal power supply node 710 is within the threshold of external power supply voltage 725 (e.g., or different external power supply voltages, in some cases), the respective internal power supply node 710 may be clamped (e.g., maintained) using clamps 745-a, 745-b, and 745-c, respectively (e.g., and bleeder circuits 740 may be disabled).

In some examples, a complete signal 770 may be generated by a group of internal power supplies 702 when at least one of the internal power supplies of the group has been clamped to a respective external power supply voltage. For example, a complete signal 770 may be generated when at least one of the internal power supplies of the second group of internal power supplies 702-c has been modified and clamped. Alternatively, complete signal 770 may be generated when at least one of the internal power supplies of the second group of internal power supplies 702-c has been modified and clamped (e.g., using an AND gate). In such cases, the third group of internal power supplies 702-c (e.g., and corresponding internal power supply voltages 715) may be modified to respective external voltages based on a fourth signal 775 generated from the third signal 765 (e.g., which may be generated by the on-die timer) and the complete signal 770 (e.g., an AND operation of the third signal and the complete signal 770). Activation of signal 775 (e.g., transitioning to a logic state corresponding to modifying of the third group of internal power supplies 702-c) may, for example, enable bleeder circuits 740-g and 740-h, and enable comparators 750-d and 750-e.

Bleeder circuits 740-g and 740-h may be enabled until the respective comparator 750-d or 750-e determines that the voltage at respective internal power supply node 715 is within a threshold of external power supply voltage 725. When the voltage at the respective internal power supply node 715 is within the threshold of external power supply voltage 725 (e.g., or different external power supply voltages, in some cases), the respective internal power supply node 715 may be clamped (e.g., maintained) using clamps 745-d and 745-e, respectively (e.g., and bleeder circuits 740 may be disabled). Although, FIG. 7 illustrates complete signal 770 generated using the same comparators 750 as used to enable the clamping circuits 745, separate comparators with separate thresholds may be used, in some cases. For example, complete signal 770 may use higher thresholds than clamping circuits 745, such that in some cases the bleeder circuits for the next group (e.g., the third group) may be allowed to be enabled prior to the clamping of one or more of the internal power supplies of the second group of internal power supplies 702-b.

Although the first group of internal power supplies 702-a is illustrated using bleeder circuits 740 and without clamping circuits 745 or comparators 750 (e.g., due to the lower voltages resulting in more determinate bleeding time), one or more internal power supplies of the first group of internal power supplies 702-a may include a clamping circuit 745 or comparator 750. Additionally, a complete signal may be generated from the first group of internal power supplies 702-a as well as the second group of internal power supplies 702-b (e.g., using comparators 750).

Figure 8:
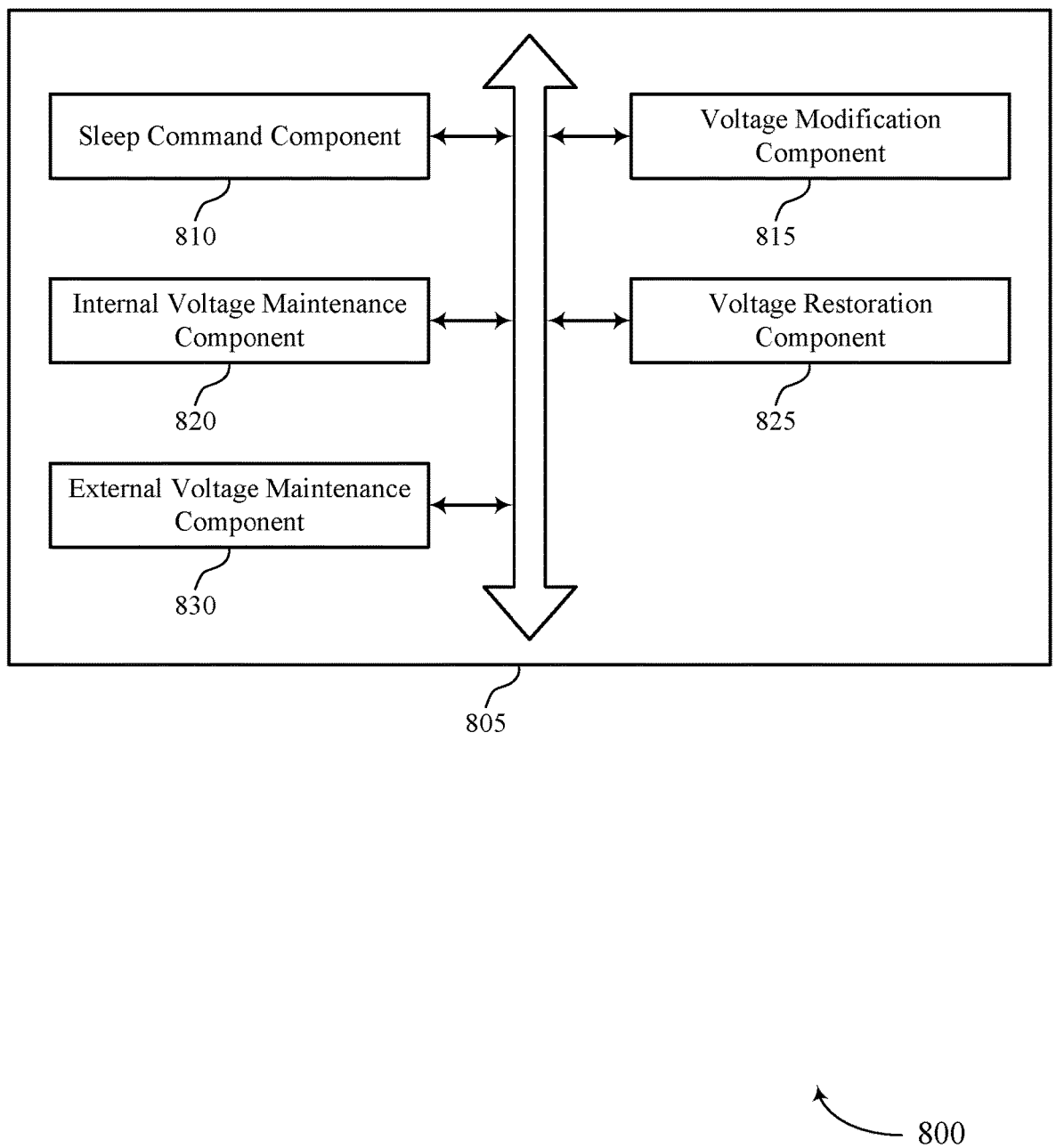
FIG. 8 shows a block diagram of a memory device that supports grouping power supplies for a power saving mode in accordance with aspects of the present disclosure.

FIG. 8 shows a block diagram 800 of a memory device 805 that supports grouping power supplies for a power saving mode in accordance with examples as disclosed herein. The memory device 805 may be an example of aspects of a memory device as described with reference to FIGS. 1-7. The memory device 805 may include a sleep command component 810, a voltage modification component 815, an internal voltage maintenance component 820, a voltage restoration component 825, and an external voltage maintenance component 830. Each of these modules may communicate, directly or indirectly, with one another (e.g., via one or more buses).

The sleep command component 810 may receive, at a memory device at a first time, a command indicating for the memory device to enter a sleep mode, where the memory device includes a set of internal power supplies associated with a set of respective voltage levels. In some examples, the sleep command component 810 may receive, at the memory device at a third time, a fourth time, or a fifth time, a second command indicating for the memory device to exit the sleep mode.

The voltage modification component 815 may modify respective voltage levels for a first subset of the set of internal power supplies at a second time based on receiving the command, where at least one of the first subset of the set of internal power supplies is associated with a first voltage level different than external power supply voltage levels. In some examples, the voltage modification component 815 may modify the respective voltage levels for a second subset of the set of internal power supplies at a third time based on receiving the command. In some examples, the voltage modification component 815 may modify the respective voltage levels for the third subset of the set of internal power supplies at a fourth time based on receiving the command.

In some cases, the first subset of the set of internal power supplies is associated with a first threshold for forward voltage biasing, a first voltage level threshold for power supply operations, or a combination thereof. In some cases, the second subset of the set of internal power supplies is associated with a second threshold for forward voltage biasing, a second voltage level threshold for power supply operations, or a combination thereof.

In some examples, the voltage modification component 815 may activate respective bleeder circuits to modify the respective voltage levels of the first subset of the set of internal power supplies from respective first operating voltage levels to respective threshold voltage levels from respective first external power supply voltage levels. In some examples, the voltage modification component 815 may compare, via respective comparators coupled with the respective bleeder circuits, the respective voltage levels of the first subset of the set of internal power supplies with the respective first external power supply voltage levels. In some examples, the voltage modification component 815 may deactivate the respective bleeder circuits based on comparing the respective voltage levels of the first subset of the set of internal power supplies with the respective first external power supply voltage levels. In some cases, each respective first voltage level of the first subset of the set of internal power supplies is higher than each respective first external power supply voltage level.

The internal voltage maintenance component 820 may maintain, at the second time, respective voltage levels for the second subset of the set of internal power supplies based on receiving the command, where at least one of the second subset of the set of internal power supplies is associated with a second voltage level different than the external power supply voltage levels. In some examples, the internal voltage maintenance component 820 may maintain, at the second time and the third time, respective voltage levels for a third subset of the set of internal power supplies based on receiving the command, where at least one of the third subset of the set of internal power supplies is associated with a third voltage level different than the external power supply voltage levels.

In some examples, the internal voltage maintenance component 820 may activate a respective clamper circuit is based at least part on the respective voltage level of a respective internal power supply of the first subset of the set of internal power supplies reaching a respective threshold voltage level from a respective first external power supply voltage level.

The voltage restoration component 825 may modify the respective voltage levels for the first subset of the set of internal power supplies at a fourth time based on receiving the second command, where the modifying includes restoring the at least one of the first subset of the set of internal power supplies to the first voltage level. In some examples, the voltage restoration component 825 may modify the respective voltage levels for the second subset of the set of internal power supplies at a fifth time based on receiving the second command, where the modifying includes restoring the at least one of the second subset of the set of internal power supplies to the second voltage level.

In some examples, the voltage restoration component 825 may modify the respective voltage levels for the first subset of the set of internal power supplies at a sixth time based on receiving the second command, where the modifying includes restoring the at least one of the first subset of the set of internal power supplies to the first voltage level. In some examples, the voltage restoration component 825 may modify the respective voltage levels for the third subset of the set of internal power supplies at a sixth time based on receiving the second command, where the modifying includes restoring the at least one of the third subset of the set of internal power supplies to the third voltage level.

In some examples, the voltage restoration component 825 may modify the respective voltage levels for the second subset of the set of internal power supplies at a seventh time based on receiving the second command, where the modifying includes restoring the at least one of the second subset of the set of internal power supplies to the second voltage level. In some examples, the voltage restoration component 825 may modify the respective voltage levels for the first subset of the set of internal power supplies at an eighth time based on receiving the second command, where the modifying includes restoring the at least one of the first subset of the set of internal power supplies to the first voltage level.

The external voltage maintenance component 830 may maintain, at the fifth time, the respective voltage levels for the first subset of the set of internal power supplies based on receiving the second command. In some examples, the external voltage maintenance component 830 may maintain, at the sixth time, the respective voltage levels for the second subset and first subset of the set of internal power supplies based on receiving the second command. In some examples, the external voltage maintenance component 830 may maintain, at the seventh time, the respective voltage levels for the first subset of the set of internal power supplies based on receiving the second command.

In some examples, the external voltage maintenance component 830 may activate, based on comparing the respective voltage levels of the first subset of the set of internal power supplies with the respective first external power supply voltage levels, respective clamper circuits coupled with the respective comparators to maintain the respective voltage levels of the first subset of the set of internal power supplies at the respective threshold voltage levels from the respective first external power supply voltage levels.

Figure 9:
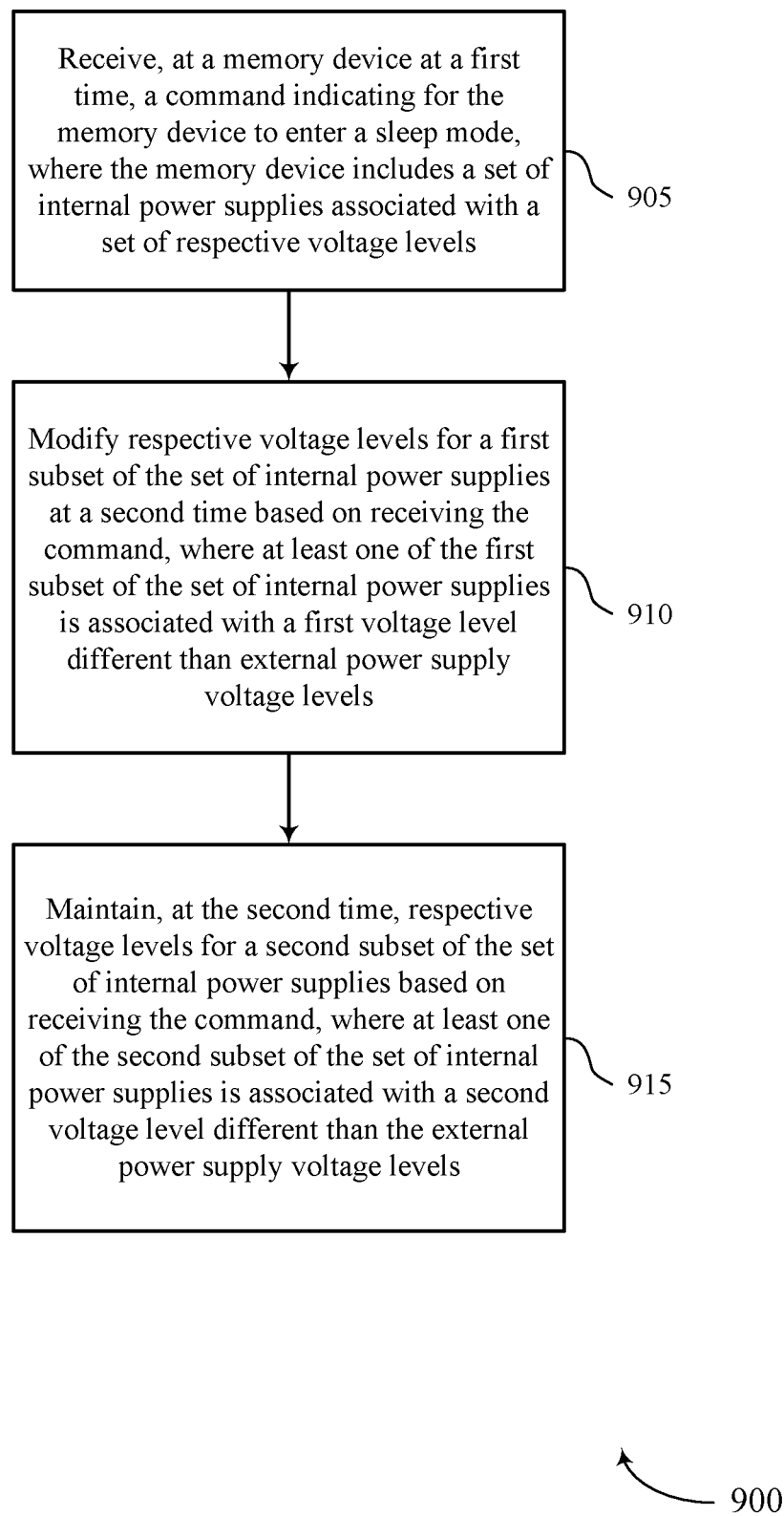
FIGS. 9 and 10 show flowcharts illustrating a method or methods that support grouping power supplies for a power saving mode in accordance with examples as disclosed herein.

FIG. 9 shows a flowchart illustrating a method or methods 900 that supports grouping power supplies for a power saving mode in accordance with aspects of the present disclosure. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may receive, at a memory device at a first time, a command indicating for the memory device to enter a sleep mode, where the memory device includes a set of internal power supplies associated with a set of respective voltage levels. The operations of 905 may be performed according to the methods described herein. In some examples, aspects of the operations of 905 may be performed by a sleep command component as described with reference to FIG. 8.

At 910, the memory device may modify respective voltage levels for a first subset of the set of internal power supplies at a second time based on receiving the command, where at least one of the first subset of the set of internal power supplies is associated with a first voltage level different than external power supply voltage levels. The operations of 910 may be performed according to the methods described herein. In some examples, aspects of the operations of 910 may be performed by a voltage modification component as described with reference to FIG. 8.

At 915, the memory device may maintain, at the second time, respective voltage levels for a second subset of the set of internal power supplies based on receiving the command, where at least one of the second subset of the set of internal power supplies is associated with a second voltage level different than the external power supply voltage levels. The operations of 915 may be performed according to the methods described herein. In some examples, aspects of the operations of 915 may be performed by an internal voltage maintenance component as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for receiving, at a memory device at a first time, a command indicating for the memory device to enter a sleep mode, where the memory device includes a set of internal power supplies associated with a set of respective voltage levels, modifying respective voltage levels for a first subset of the set of internal power supplies at a second time based on receiving the command, where at least one of the first subset of the set of internal power supplies is associated with a first voltage level different than external power supply voltage levels, and maintaining, at the second time, respective voltage levels for a second subset of the set of internal power supplies based on receiving the command, where at least one of the second subset of the set of internal power supplies is associated with a second voltage level different than the external power supply voltage levels.

Some examples of the method 900 and the apparatus described herein may further include operations, features, means, or instructions for receiving, at the memory device at a third time, a second command indicating for the memory device to exit the sleep mode, and modifying the respective voltage levels for the first subset of the set of internal power supplies at a fourth time based on receiving the second command, where the modifying includes restoring the at least one of the first subset of the set of internal power supplies to the first voltage level.

Some examples of the method 900 and the apparatus described herein may further include operations, features, means, or instructions for modifying the respective voltage levels for the second subset of the set of internal power supplies at a third time based on receiving the command.

Some examples of the method 900 and the apparatus described herein may further include operations, features, means, or instructions for receiving, at the memory device at a fourth time, a second command indicating for the memory device to exit the sleep mode, modifying the respective voltage levels for the second subset of the set of internal power supplies at a fifth time based on receiving the second command, where the modifying includes restoring the at least one of the second subset of the set of internal power supplies to the second voltage level, maintaining, at the fifth time, the respective voltage levels for the first subset of the set of internal power supplies based on receiving the second command, and modifying the respective voltage levels for the first subset of the set of internal power supplies at a sixth time based on receiving the second command, where the modifying includes restoring the at least one of the first subset of the set of internal power supplies to the first voltage level.

Some examples of the method 900 and the apparatus described herein may further include operations, features, means, or instructions for maintaining, at the second time and the third time, respective voltage levels for a third subset of the set of internal power supplies based on receiving the command, where at least one of the third subset of the set of internal power supplies may be associated with a third voltage level different than the external power supply voltage levels.

Some examples of the method 900 and the apparatus described herein may further include operations, features, means, or instructions for modifying the respective voltage levels for the third subset of the set of internal power supplies at a fourth time based on receiving the command.

Some examples of the method 900 and the apparatus described herein may further include operations, features, means, or instructions for receiving, at the memory device at a fifth time, a second command indicating for the memory device to exit the sleep mode, modifying the respective voltage levels for the third subset of the set of internal power supplies at a sixth time based on receiving the second command, where the modifying includes restoring the at least one of the third subset of the set of internal power supplies to the third voltage level, maintaining, at the sixth time, the respective voltage levels for the second subset and first subset of the set of internal power supplies based on receiving the second command, modifying the respective voltage levels for the second subset of the set of internal power supplies at a seventh time based on receiving the second command, where the modifying includes restoring the at least one of the second subset of the set of internal power supplies to the second voltage level, maintaining, at the seventh time, the respective voltage levels for the first subset of the set of internal power supplies based on receiving the second command, and modifying the respective voltage levels for the first subset of the set of internal power supplies at an eighth time based on receiving the second command, where the modifying includes restoring the at least one of the first subset of the set of internal power supplies to the first voltage level.

In some examples of the method 900 and the apparatus described herein, the first subset of the set of internal power supplies may be associated with a first threshold for forward voltage biasing, a first voltage level threshold for power supply operations, or a combination thereof, and the second subset of the set of internal power supplies may be associated with a second threshold for forward voltage biasing, a second voltage level threshold for power supply operations, or a combination thereof.

In some examples of the method 900 and the apparatus described herein, modifying the respective voltage levels for the first subset of the set of internal power supplies may include operations, features, means, or instructions for activating respective bleeder circuits to modify the respective voltage levels of the first subset of the set of internal power supplies from respective first operating voltage levels to respective threshold voltage levels from respective first external power supply voltage levels.

In some examples of the method 900 and the apparatus described herein, modifying the respective voltage levels for the first subset of the set of internal power supplies further may include operations, features, means, or instructions for comparing, via respective comparators coupled with the respective bleeder circuits, the respective voltage levels of the first subset of the set of internal power supplies with the respective first external power supply voltage levels, deactivating the respective bleeder circuits based on comparing the respective voltage levels of the first subset of the set of internal power supplies with the respective first external power supply voltage levels, and activating, based on comparing the respective voltage levels of the first subset of the set of internal power supplies with the respective first external power supply voltage levels, respective clamper circuits coupled with the respective comparators to maintain the respective voltage levels of the first subset of the set of internal power supplies at the respective threshold voltage levels from the respective first external power supply voltage levels.

Some examples of the method 900 and the apparatus described herein may further include operations, features, means, or instructions for activating a respective clamper circuit may be based at least part on the respective voltage level of a respective internal power supply of the first subset of the set of internal power supplies reaching a respective threshold voltage level from a respective first external power supply voltage level.

In some examples of the method 900 and the apparatus described herein, each respective first voltage level of the first subset of the set of internal power supplies may be higher than each respective first external power supply voltage level.

Figure 10:
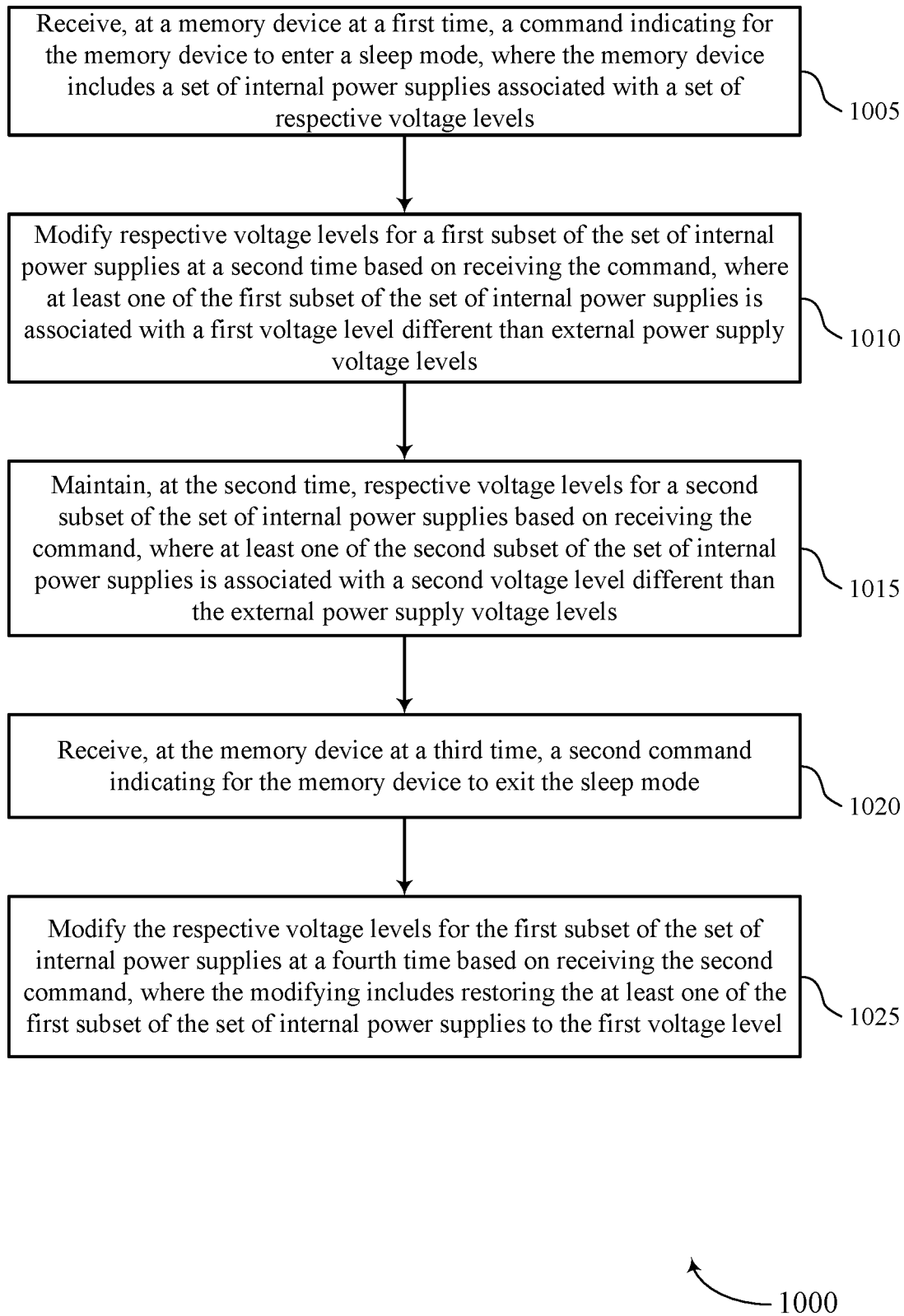

FIG. 10 shows a flowchart illustrating a method or methods 1000 that supports grouping power supplies for a power saving mode in accordance with aspects of the present disclosure. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may receive, at a memory device at a first time, a command indicating for the memory device to enter a sleep mode, where the memory device includes a set of internal power supplies associated with a set of respective voltage levels. The operations of 1005 may be performed according to the methods described herein. In some examples, aspects of the operations of 1005 may be performed by a sleep command component as described with reference to FIG. 8.

At 1010, the memory device may modify respective voltage levels for a first subset of the set of internal power supplies at a second time based on receiving the command, where at least one of the first subset of the set of internal power supplies is associated with a first voltage level different than external power supply voltage levels. The operations of 1010 may be performed according to the methods described herein. In some examples, aspects of the operations of 1010 may be performed by a voltage modification component as described with reference to FIG. 8.

At 1015, the memory device may maintain, at the second time, respective voltage levels for a second subset of the set of internal power supplies based on receiving the command, where at least one of the second subset of the set of internal power supplies is associated with a second voltage level different than the external power supply voltage levels. The operations of 1015 may be performed according to the methods described herein. In some examples, aspects of the operations of 1015 may be performed by an internal voltage maintenance component as described with reference to FIG. 8.

At 1020, the memory device may receive, at the memory device at a third time, a second command indicating for the memory device to exit the sleep mode. The operations of 1020 may be performed according to the methods described herein. In some examples, aspects of the operations of 1020 may be performed by a sleep command component as described with reference to FIG. 8.

At 1025, the memory device may modify the respective voltage levels for the first subset of the set of internal power supplies at a fourth time based on receiving the second command, where the modifying includes restoring the at least one of the first subset of the set of internal power supplies to the first voltage level. The operations of 1025 may be performed according to the methods described herein. In some examples, aspects of the operations of 1025 may be performed by a voltage restoration component as described with reference to FIG. 8.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a set of internal power supplies associated with a set of respective voltage levels, the set of internal power supplies including a first subset of internal power supplies that includes a first internal power supply associated with a first voltage level different than external power supply voltage levels and a second subset of internal power supplies that includes a second internal power supply associated with a second voltage level different than the external power supply voltage levels. The apparatus may also include a controller configured to receive, at a first time, a command indicating for the apparatus to enter a sleep mode, modify respective voltage levels for the first subset of the set of internal power supplies at a second time based on receiving the command, and maintain, at the second time, respective voltage levels for the second subset of the set of internal power supplies based on receiving the command.

Some examples of the controller may be further configured to receive, at the apparatus at a third time, a second command indicating for the apparatus to exit the sleep mode, and modify the respective voltage levels for the first subset of the set of internal power supplies at a fourth time based on receiving the second command, where the modifying includes restoring the first internal power supply to the first voltage level.

Some examples of the controller may be further configured to modify the respective voltage levels for the second subset of the set of internal power supplies at a third time based on receiving the command.

Some examples of the controller may be further configured to receive, at the apparatus at a fourth time, a second command indicating for the apparatus to exit the sleep mode, modify the respective voltage levels for the second subset of the set of internal power supplies at a fifth time based on receiving the second command, where the modifying includes restoring the second internal power supply to the second voltage level. The controller may further be configured to maintain, at the fifth time, the respective voltage levels for the first subset of the set of internal power supplies based on receiving the second command, and modify the respective voltage levels for the first subset of the set of internal power supplies at a sixth time based on receiving the second command, where the modifying includes restoring the first internal power supply to the first voltage level.

In some examples, the first subset of the set of internal power supplies may be associated with a first threshold for forward voltage biasing, a first voltage level threshold for power supply operations, or a combination thereof, and the second subset of the set of internal power supplies may be associated with a second threshold for forward voltage biasing, a second voltage level threshold for power supply operations, or a combination thereof.

In some examples, the apparatus further may include a set of bleeder circuits, including a first subset of bleeder circuits configured to modify the respective voltage levels of the first subset of the set of internal power supplies from respective first operating voltage levels to respective first threshold voltage levels from respective first external power supply voltage levels and a second subset of bleeder circuits configured to modify the respective voltage levels of the second subset of the set of internal power supplies from respective second operating voltage levels to respective second threshold voltage levels from respective second external power supply voltage levels. The apparatus may further include a set of comparator circuits, including a first subset of comparator circuits coupled with respective bleeder circuits of the first subset of bleeder circuits and configured to compare the respective voltage levels of the first subset of the set of internal power supplies with the respective first external power supply voltage levels and a second subset of comparator circuits coupled with respective bleeder circuits of the second subset of bleeder circuits and configured to compare the respective voltage levels of the second subset of the set of internal power supplies with the respective second external power supply voltage levels.

In some examples, each respective first operating voltage level of the first subset of the set of internal power supplies may be higher than each respective first external power supply voltage level, and each respective second operating voltage level of the second subset of the set of internal power supplies may be higher than each respective second external power supply voltage level.

In some examples, the apparatus further may include a set of clamper circuits, including a first subset of clamper circuits coupled with respective comparator circuits of the first subset of comparator circuits and configured to maintain the respective voltage levels of the first subset of the set of internal power supplies at the respective first threshold voltage levels from the respective first external power supply voltage levels based on the respective comparator circuits of the first subset and a second subset of clamper circuits coupled with respective comparator circuits of the second subset of comparator circuits and configured to maintain the respective voltage levels of the second subset of the set of internal power supplies at the respective second threshold voltage levels from the respective second external power supply voltage levels based on the respective comparator circuits of the second subset.

Some examples of the controller may further be configured to activate a respective clamper circuit of the first subset of clamper circuits based at least part on the respective voltage level of a respective internal power supply of the first subset of the set of internal power supplies reaching a respective voltage level threshold.

An apparatus is described. The apparatus may include a first internal power supply associated with a first voltage level different than external power supply voltage levels, a second internal power supply associated with a second voltage level different than the first voltage level and different than the external power supply voltage levels, a set of bleeder circuits including a first bleeder circuit configured to modify the first voltage level of the first internal power supply to a first external power supply voltage level and a second bleeder circuit configured to modify the second voltage level of the second internal power supply to a second external power supply voltage level, and a set of clamper circuits including a first clamper circuit configured to maintain the first internal power supply at the first external power supply voltage level and a second clamper circuit configured to maintain the second internal power supply at the second external power supply voltage level.

Some examples of the apparatus may include a third internal power supply associated with a third voltage level different than the first voltage level, the second voltage level, and the external power supply voltage levels, a third bleeder circuit of the set of bleeder circuits, the third bleeder circuit configured to modify the third voltage level of the third internal power supply to a third external power supply voltage level, and a third clamper circuit of the set of clamper circuits, the third clamper circuit configured to maintain the third internal power supply at the third external power supply voltage level.

In some examples, the first bleeder circuit may include one or more switching components configured to selectively couple the first internal power supply with a first external power supply having the first external power supply voltage level, and one or more resistors selectively couplable with the first internal power supply or the first external power supply via the one or more switching components.

In some examples, each clamper circuit of the set of clamper circuits may be coupled with a respective comparator circuit configured to compare a respective voltage level of a respective internal power supply with a respective external power supply voltage level.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
 a set of internal power supplies associated with a plurality of respective voltage levels, the set of internal power supplies comprising:
  a first subset of internal power supplies associated with respective voltage levels different than a set of external power supply voltage levels; and
  a second subset of internal power supplies associated with respective voltage levels different than the set of external power supply voltage levels; and a set of on-die timers configured to generate a set of signals to adjust the respective voltage levels associated with the first subset of internal power supplies and the respective voltage levels associated with the second subset of internal power supplies in a first order upon an entry of a sleep mode, wherein the first order is programmed by the set of on-die timers.

2. The apparatus of claim 1, wherein the set of on-die timers are configured to adjust the respective voltage levels associated with the first subset of internal power supplies and the respective voltage levels associated with the second subset of internal power supplies in a second order upon an exit of the sleep mode, and wherein the second order is opposite to the first order.

3. The apparatus of claim 1, further comprising:
a controller configured to receive a command indicating to enter or exit the sleep mode.

4. The apparatus of claim 3, wherein the controller is further configured to:
receive a latch signal that indicates to the set of internal power supplies that the apparatus is entering the sleep mode.

5. The apparatus of claim 1, wherein the set of on-die timers are configured to:
program the first subset of internal power supplies to enter or exit the sleep mode; and
program the second subset of internal power supplies to enter or exit the sleep mode after the first subset of internal power supplies enters or exits the sleep mode.

6. The apparatus of claim 1, wherein the set of on-die timers is based at least in part on an internal clock.

7. The apparatus of claim 1, wherein the set of on-die timers are coupled with a voltage supply for maintaining operation during the sleep mode.

8. An apparatus, comprising:
a set of internal power supplies comprising:
a first subset of internal power supplies associated with respective voltage levels different than a set of external power supply voltage levels; and
a second subset of internal power supplies associated with respective voltage levels different than the set of external power supply voltage levels; and
a set of on-die timers coupled with the apparatus and configured to:
modify a state of a first signal to represent a first flag indicating for the first subset of internal power supplies to adjust the respective voltage levels associated with the first subset of internal power supplies based at least in part upon an entry of a sleep mode; and
modify a state of a second signal to represent a second flag indicating for the second subset of internal power supplies to adjust the respective voltage levels associated with the second subset of internal power supplies based at least in part upon the entry of the sleep mode, wherein the modification of the respective states of the first signal and the second signal is performed according to a first order upon the entry of the sleep mode, and wherein a second order is opposite to the first order, wherein the first order is programmed by the set of on-die timers.

9. The apparatus of claim 8, wherein the set of on-die timers are configured to:
modify the state of the first signal to represent a third flag indicating for the first subset of internal power supplies to adjust the respective voltage levels associated with the first subset of internal power supplies based at least in part upon an exit of the sleep mode; and
modify the state of the second signal to represent a fourth flag indicating for the second subset of internal power supplies to adjust the respective voltage levels associated with the second subset of internal power supplies based at least in part upon the exit of the sleep mode, wherein the modification of the respective states of the first signal and the second signal is performed according to the second order upon the exit of the sleep mode.

10. The apparatus of claim 8, further comprising:
one or more circuits that are configured to modify the respective voltage levels associated with the first subset of internal power supplies to respective external supply voltage levels based at least in part on the first flag, and to modify the respective voltage levels associated with the second subset of internal power supplies to respective external supply voltage levels based at least in part on the second flag.

11. The apparatus of claim 8, wherein the set of on-die timers are further configured to:
maintain the first subset of internal power supplies, the second subset of internal power supplies of the set of internal power supplies, or both, at a steady voltage level upon the entry of the sleep mode.

12. The apparatus of claim 11, wherein to maintain the first subset of internal power supplies, the second subset of internal power supplies, or both at the steady voltage level is based at least in part on one or more sleep mode settings.

13. The apparatus of claim 8, wherein the set of on-die timers are further configured to:
maintain each internal power supply voltage of the first subset of internal power supplies at a respective external power supply voltage level upon the entry of the sleep mode.

14. The apparatus of claim 8, further comprising:
a third subset of internal power supplies associated with respective voltage levels different than the set of external power supply voltage levels,
wherein the set of on-die timers are configured to modify a state of a third signal to represent a third flag indicating for the third subset of internal power supplies to adjust the respective voltage levels associated with the third subset of internal power supplies based at least in part upon the entry of the sleep mode.

15. The apparatus of claim 8, wherein the first subset of internal power supplies and the second subset of internal power supplies of the set of internal power supplies are grouped based at least in part on a relationship of the first subset of internal power supplies and the second subset of internal power supplies.

16. The apparatus of claim 15, wherein the relationship is based at least in part on a respective voltage range associated with the first subset of internal power supplies and the second subset of internal power supplies.

17. The apparatus of claim 15, wherein the relationship is based at least in part on a difference of voltage levels between the first subset of internal power supplies and the second subset of internal power supplies, a range of voltage levels associated with the first subset of internal power supplies and the second subset of internal power supplies, or a latch-up criterion, or any combination thereof.

18. The apparatus of claim 8, further comprising:
one or more bleeder circuits configured to modify one or more of the respective voltage levels associated with the first subset of internal power supplies based at least in part on the first signal.

19. The apparatus of claim 18, further comprising:
one or more comparators configured to compare the one or more of the respective voltage levels associated with the first subset of internal power supplies to one or more threshold voltages, the one or more threshold voltages based at least in part on one or more of the set of external power supply voltage levels.

20. The apparatus of claim 19, further comprising:
one or more clamper circuits configured to clamp the one or more of the respective voltage levels associated with the first subset of internal power supplies to the one or more of the set of external power supply voltage levels based at least in part on a result of the comparison of the one or more of the respective voltage levels associated with the first subset of internal power supplies to the one or more threshold voltages.

* * * * *